(12) United States Patent
Koguchi et al.

(10) Patent No.: US 6,383,286 B1
(45) Date of Patent: May 7, 2002

(54) METHOD OF MAKING SEMICONDUCTOR SUPER-ATOM AND AGGREGATE THEREOF

(75) Inventors: Nobuyuki Koguchi; Shiro Tsukamoto, both of Ibaraki (JP)

(73) Assignee: Japan as represented by Director General of National Research Institute for Metals, Ibaraki (JP)

( * ) Notice: Subject to any disclaimer, the term of this patent is extended or adjusted under 35 U.S.C. 154(b) by 0 days.

(21) Appl. No.: 09/584,092

(22) Filed: May 31, 2000

(30) Foreign Application Priority Data

May 31, 1999 (JP) .............................. 11-152647
May 29, 2000 (JP) ....................... 2000-157613

(51) Int. Cl.[7] .............................................. C30B 13/10
(52) U.S. Cl. .......................................... 117/54; 117/55
(58) Field of Search ....................... 117/54, 55

(56) References Cited

U.S. PATENT DOCUMENTS 5,422,305 A * 6/1995 Seabaugh et al.
5,561,079 A * 10/1996 Partin

OTHER PUBLICATIONS

Recognition Properties of the Nano–Ordered Structures of Bis(Mercaptomethyl) Terthiophene Monolayers on Au(111); Nakamura, et al;Synthetic Metals (Jun. 1999) vol. 103 No. 1–3, pp. 2143–2144.*

* cited by examiner

*Primary Examiner*—Felisa Hiteshew
(74) *Attorney, Agent, or Firm*—Wenderoth, Lind & Ponnack, LLP

(57) ABSTRACT

The present invention probides a novel method for fabricating a semiconductor super-atom and an aggregate thereof, which allows the formation of a semiconductor nano-structure with a diameter in the order of 10 nm, which is meant for constituting a core, and allows the doping of impurity atoms only to the core portion with the number of the impurity atoms being controlled. For example, droplet epitaxy is employed for the formation of the semiconductor nano-structure which constitutes the core, and scanning tunnel microscopy is employed for the doping of impurity atoms into the semiconductor nano-structure, so as to selectively introduce the impurity atoms only into the core, with the number of the impurity atoms controlled with a single-atom level accuracy

8 Claims, 4 Drawing Sheets

METHOD OF MAKING SEMICONDUCTOR SUPER-ATOM AND AGGREGATE THEREOF

FIELD OF THE INVENTION

The present invention relates to a method of making a semiconductor super-atom and an aggregate thereof. More particuarly, the present invention relates to a novel method of making a semiconductor super-atom and a method of making an aggregate of semiconductor super-atoms, that are useful for next-generation electronics such as computing devices for quantum computers, electronic elements highly variable by external fields, e.g. electric/magnetic field, and electrically conducting paths etc.

BACKGROUND OF THE INVENTION

During late years, in the field of electronics, active studies are being conducted on next-generation electronics, such as computing devices for quantum computers, electronic elements highly variable by external fields of electric/magnetic field etc., ultra high-speed one dimensional electrically conducting paths, and new device materials are continuously being searched for, attempting to realize the next-generation electronics. Now, attracting attention as one type of such device materials, is an artificial giant quasi-atom, or super-atom, constituted by a nano-meter-scale 3-dimensional semiconductor hetero-junction structure, the concept of which had been proposed in 1986.

A semiconductor super-atom is defined as a structure where a singlecrystalline minute sphere (core) containing impurity atoms of donors or acceptors is embedded in a parent-phase singlecrystal without impurities and where the relationship between the parent-phase and the core is the reverse of a typical quantum dot structure. As an example thereof, the one utilizing GaAs as the parent-phase and AlGaAs as the core has already been proposed.

The internal mechanisms of a semiconductor super-atom have been made clear to a certain extent. That is, if the step at the edge hetero-interface of a conduction band (parent-phase) is sufficiently large, then donors (impurity atoms) are ionized and electrons shift to the conduction band of the parent-phase. Those electrons will be attracted to the positively charged donors, but are blocked by an interface barrier and they remain in proximity of the core. Although this phenomenon is the same as the well-known phenomenon in modulation-doped 2-dimensional electron system, if the diameter of the core is as minute as de Broglie wave length of electrons (approx. 10 nm), the electrons are quantized to have an atomic-like discrete level, so that this system may be viewed as a giant quasi-atom, or super-atom. Since, at this point, the core has overall electric charge of +Ze, Z would be the atomic number of the super atom.

There have been several methods proposed for making such a semiconductor super-atom, and the basic concept in those various methods is to form a semiconductor nano-structure as a core with a diameter in the order of 10 nm, and to add impurity atoms only to the semiconductor nano-structure, or core, with the number of the impurity atoms being controlled with a single-atom level accuracy. Also, by placing a number of the semiconductor super-atoms in an interval of 100 nm or less, an aggregate of semiconductor super-atoms can be formed.

The conventional methods that had been proposed, include;

1) a method employing single-atom manipulation technologies using field ion microscopy or scanning tunneling microscopy;
2) a method employing selective growth or selective etching of minute structures using a focused electron beam;
3) a method using ultra-fine particles; and
4) a method employing lithography on a multi-layered thin film.

However, the problems listed below have been pointed out to be present in these conventional methods, and the fabrication of a semiconductor super-atom is still difficult.

In the method of 1), it takes more than half a day only to form a single semiconductor super-atom, so that the throughput is extremely low, and also, it is difficult to process a plural number of atoms including impurities.

In the method of 2), the spatial resolution of the electron beam is low, and it has been unable to gain the spatial resolution sufficient for the formation of a semiconductor super-atom.

In the method of 3), impurity atoms cannot be added selectively only to the core portion.

In the method of 4), the spatial resolution of the lithography is low, and defects can be introduced to the interface during fine processing.

Therefore, although there proposed a concept of a new device material, namely semiconductor super-atom, which seems useful for the next-generation electronics, it has been difficult, and even almost impossible to form a semiconductor nano-structure as a core with a diameter in the order of 10 nm, and to add impurity atoms only to the core while controlling the number of the impurity atoms with a single-atom level accuracy.

SUMMARY OF THE INVENTION

Accordingly, an object of the invention is to provide a novel method for making a semiconductor super-atom and an aggregate thereof, which can solve the problems described above and realize the semiconductor super-atom and aggregate thereof.

The present invention provides, at first, a method of making a semiconductor super-atom, wherein impurity atoms are selectively introduced only to a core with the number of the impurity atoms being controlled with a single-atom level accuracy, by using droplet epitaxy for formation of a semiconductor nano-structure constituting the core and scanning tunneling microscopy for addition of the impurity atoms to the semiconductor nano-structure.

Secondly, the present invention provides a method of making a semiconductor super-atom wherein impurity atoms are selectively introduced only to a core with the number of the impurity atoms being controlled with a single-atom level accuracy, by using droplet epitaxy for formation of a semiconductor nano-structure constituting the core and a focused electron beam for addition of the impurity atoms to the semiconductor nano-structure.

Thirdly, the present invention provide a method of making a semiconductor super-atom wherein impurity atoms are selectively introduced only to a core with the number of the impurity atoms being controlled with a single-atom level accuracy, by using droplet epitaxy for formation of a semiconductor nano-structure constituting the core, and a technique to promote selective adsorption of the impurity atoms into a liquid droplet during the droplet epitaxy for addition of the impurity atoms to the semiconductor nano-structure.

Fourthly, the present invention provides a method of making a semiconductor super-atom wherein impurity atoms are selectively introduced only to a core with the number of the impurity atoms being controlled with a single-atom level accuracy, by using droplet epitaxy for formation of a semiconductor nano-structure constituting the core, and a technique to promote selective dissolution of the impurity atoms present at the substrate surface into a liquid droplet during the droplet epitaxy for addition of the impurity atoms to the semiconductor nano-structure.

Fifthly, the present invention provides a method of making an aggregate of semiconductor super-atoms by forming a plural number of semiconductor super-atoms on a substrate using any one of the above methods.

BRIEF DESCRIPTION OF THE DRAWINGS

The foregoing and other objects, features and advantages of the present invention will be better understood from the following detailed description, taken in conjunction with the accompanying drawings, in which.

DETAILED DESCRIPTION OF THE PREFERRED EMBODIMENTS

The present invention is characterized as that it employs self-organized growth method of a ultra-fine structure utilizing a crystal growth mechanism called Droplet Epitaxy for the formation of a semiconductor nano-structure which constitutes a core, and also employs various techniques for doping impurity into the semiconductor nano-structure, and selectively introduces the impurity atoms such as donors or acceptors only into the core, with the number of the impurity atoms being controlled with a single-atom level accuracy. Accordingly, the present invention allows the formation of the semiconductor nano-structure with a diameter in the order of 10 nm, and doping of impurity only into the core, with the number of the impurity atoms being controlled with a single-atom level accuracy.

As for specific techniques for the doping that can be employed in conjunction with the droplet epitaxy, there are;

a) a technique using a scanning tunneling microscope;

b) a technique using a focused electron beam;

c) a technique utilizing selective adsorption phenomenon of impurity atoms into a metal liquid droplet during the droplet epitaxy; and d) a technique utilizing selective dissolution phenomenon of impurity atoms present at the substrate surface in a metal liquid droplet during the droplet epitaxy.

The following discusses each of the methods of the present invention in which the droplet epitaxy and one of the techniques a) to d) are used.

Method Using Droplet Epitaxy and a)

Figure 1A:
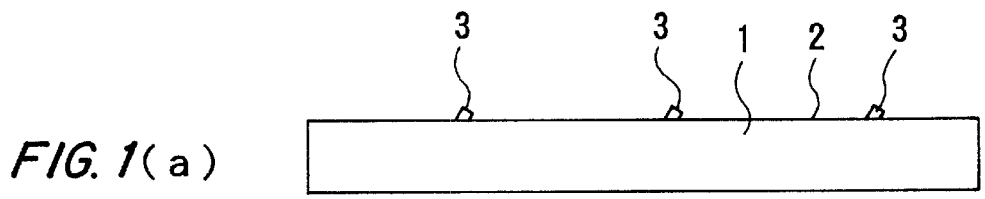
FIGS. 1(a)–(e) are schematic diagrams showing the basic concept of the present invention, which illustrate an example of the present method employing droplet epitaxy and scanning tunneling microscopy.

As shown in FIG. 1(a), an undoped epitaxial film 2 having a flat surface is formed on a parent-phase singlecrystalline substrate 1. For the formation of this thin film, a conventional thin film formation method such as molecular beam epitaxy (MBE) may be used.

Over the surface of the undoped epitaxial film 2, without breaking the vacuum, impurity atoms 3 are deposited in a number necessary as donors or acceptors by a scanning tunneling microscope (STM) having a probe made of the same atoms as the impurity atoms. For the deposition of these impurity atoms 3, a conventional deposition method such as electrolytic evaporation may be used.

Figure 1B:
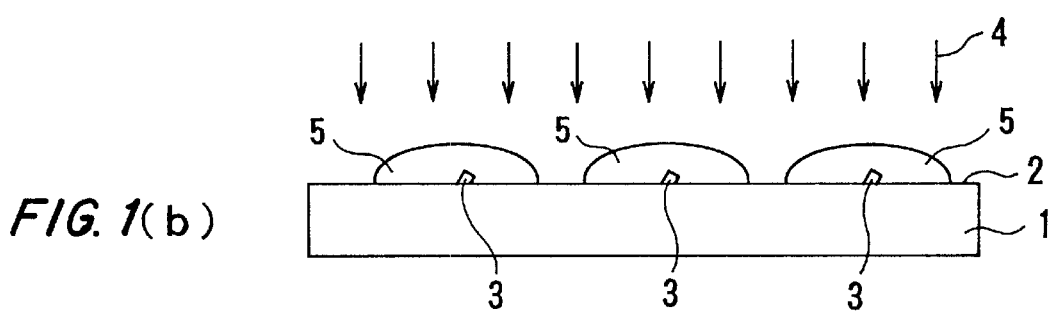

Droplet epitaxy is then performed as shown in FIG. 1(b), to supply a necessary amount of molecular beam 4 for the formation of a liquid droplet onto the surface of the undoped epitaxial film 2, thereby forming a minute liquid droplet 5. This liquid droplet 5 forms a semiconductor nano-structure which constitutes a core with a diameter in the order of 10 nm.

Figure 1C:
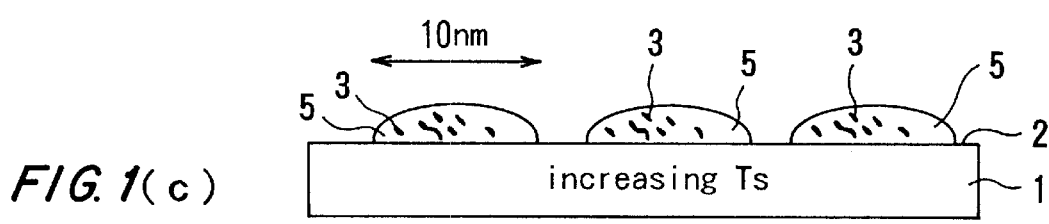

Next, as shown in FIG. 1(c), the impurity atoms 3 are made to dissolve within the liquid droplet 5.

Figure 1D:
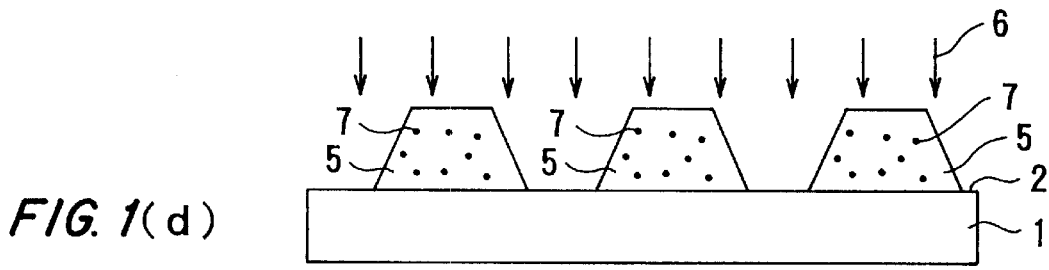
Figure 1E:
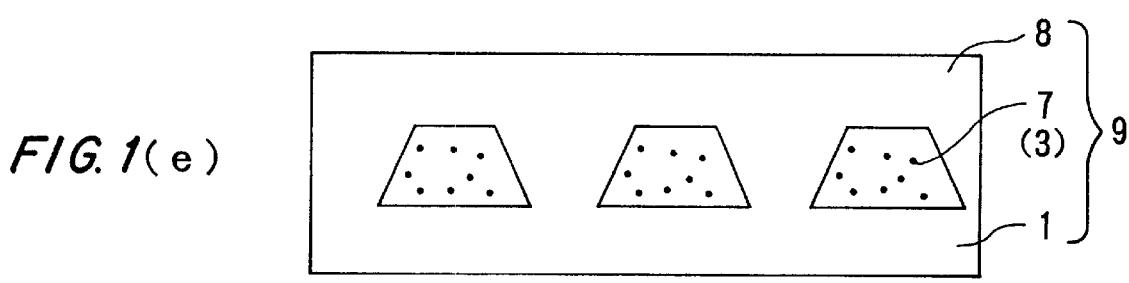

At last, as shown in FIGS. 1(d) and (e), a molecular beam 6 for growing minute crystal is irradiated so that an epitaxial minute crystal structure 7 is grown, and it is then covered by the parent-phase 8, thereby completing a semiconductor super-atom 9.

When forming a semiconductor super-atom with GaAs as a parent-phase and AlGaAs as a core, GaAs may be used for the above described parent-phase singlecrystalline substrate 1, and GaAs for the undoped epitaxial film 2 and Si for the impurity atoms 3, respectively. The use of Si as the probe of the STM allows the deposition of a necessary number of Si atoms as the impurity atoms 3. It is of course possible to apply this method to the impurity atoms 3 other donors or acceptors besides Si. As for the molecular beam 4 for the liquid droplet formation, an AlGa molecular beam may be used, and in this case, the liquid droplet 5 would be an AlGa droplet. Also, an As molecular beam may be used as the molecular beam 6 for minute crystal growth, and undoped Gas may be used as the parent-phase 8.

As shown in FIG. 1(a), the fabricated minute cluster of the impurity atoms 3 acts as a core formation site for the liquid droplet 5 that are meant to constitute a core, and by maintaining the substrate temperature at an adequate level, the impurity atoms are ultimately dissolved within the liquid droplet 5 to act as donors within the epitaxial minute crystal structure 7. Therefore, the structure fabricated in the above manner would fulfill the requirements for being a semiconductor super-atom, which has priorly been presented in the art only as a concept. That is, the method of making the present invention allows impurity atoms to be added only into the core with the number of the impurity atoms being controlled with a single-atom level accuracy, thus realizes a semiconductor super-atom.

Method Using Droplet Epitaxy and b)

Figure 2:
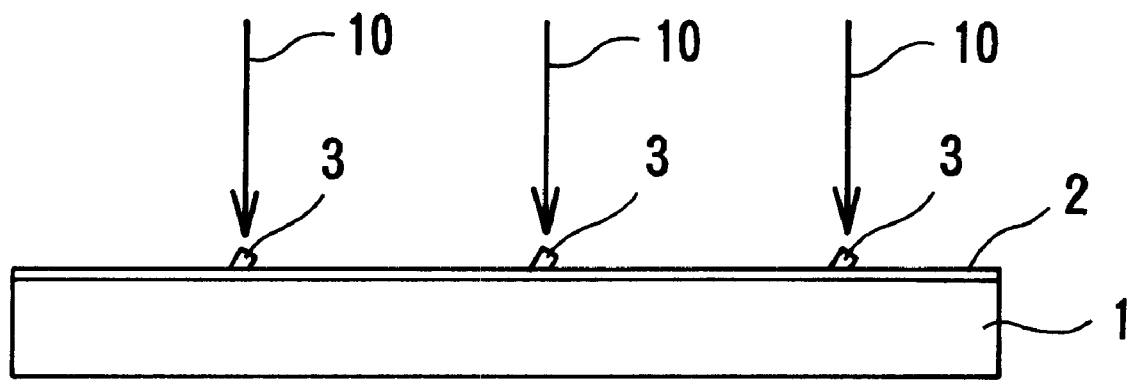
FIG. 2 is a schematic diagram showing the basic concept of the present invention, which illustrates an example of the present method employing droplet epitaxy and a focused electron beam.

In the process of FIG. 1(a), instead of using STM, as shown in FIG. 2, a focused electron beam 10 is irradiated locally onto the surface of the undoped epitaxial film 2, so as to form thereto, a cluster of impurity atoms 3 as a prioritized core formation site for the liquid droplet 5, and as an impurity source. This method can provide a large number of semiconductor super-atoms efficiently within a short period of time, on a substrate surface having a large area, so that it is extremely effective, not only in the fabrication of a single semiconductor super-atom, but also in the fabrication of an aggregate of semiconductor super-atoms. In this case, a $CH_4$ molecular beam for example, may be used as the impurity source.

Method Using Droplet Epitaxy and c)

Figure 3A:
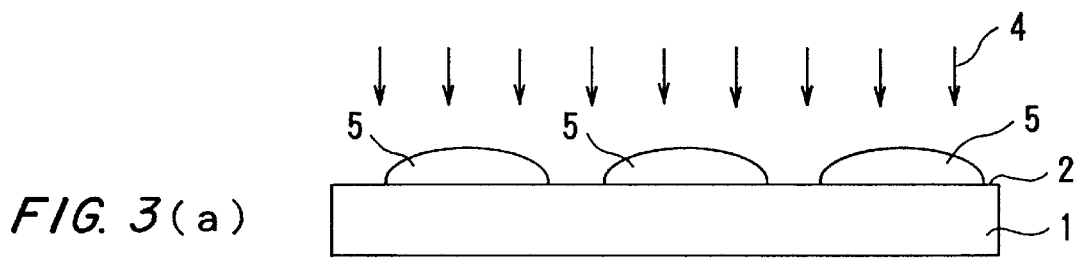
FIGS. 3(a)–(e) are schematic diagrams showing the basic concept of the present invention, which illustrate an example of the present method employing droplet epitaxy and a technique utilizing the selective adsorption phenomenon of impurity atoms into a metal liquid droplet, during the droplet epitaxy.

First, as shown in FIG. 3(a), an undoped epitaxial film 2 having a flat surface is formed on a parent-phase singlecrystalline substrate 1, and in the similar manner as in the case of conventional droplet epitaxy, a necessary amount of molecular beam 4 for liquid-droplet formation is supplied to the surface of the undoped epitaxial film 2 to form a minute liquid droplet 5 which constitutes a semiconductor nanostructure having a diameter in the order of 10 nm, meant for forming a core.

Figure 3B:
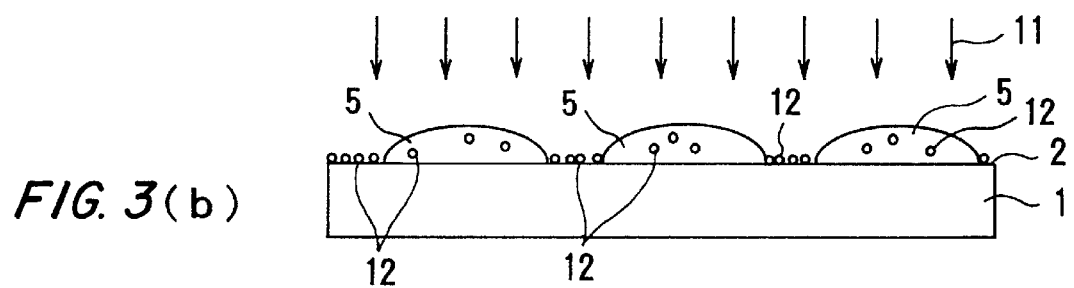

Next, as shown in FIG. 3(b), a group VI molecular beam 11 is irradiated onto the undoped epitaxial film 2. The group VI molecules 12 supplied by the group VI molecular beam 11 act as donors within the liquid droplet 5, or coro.

Figure 3C:
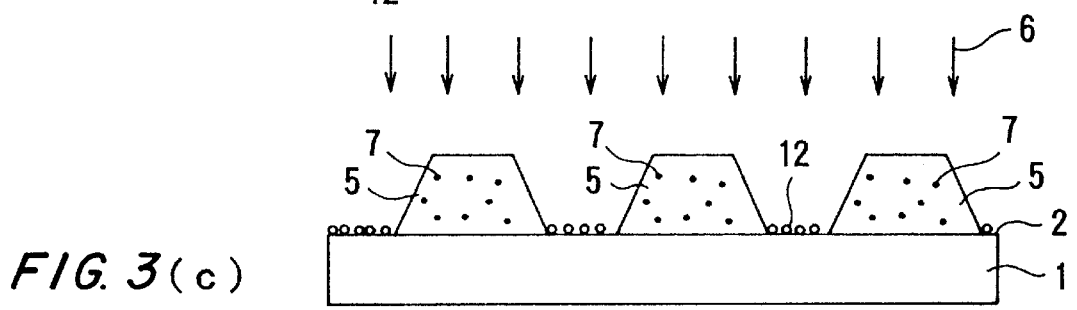

A molecular beam 6 for minute crystal growth is then irradiated onto the surface of the undoped epitaxial film 2 as shown in FIG. 3(c), to grow an epitaxial minute crystal structure 7.

Figure 3D:
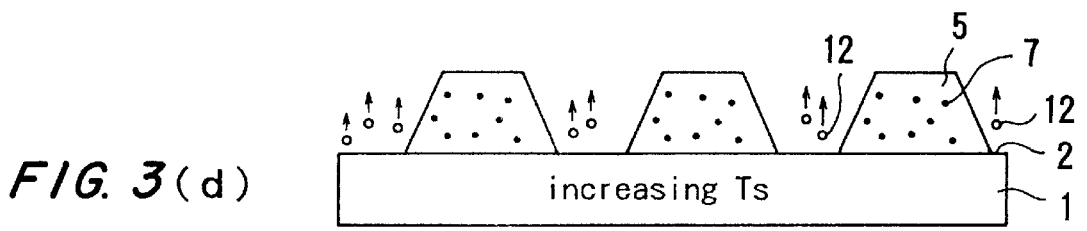
Figure 3E:
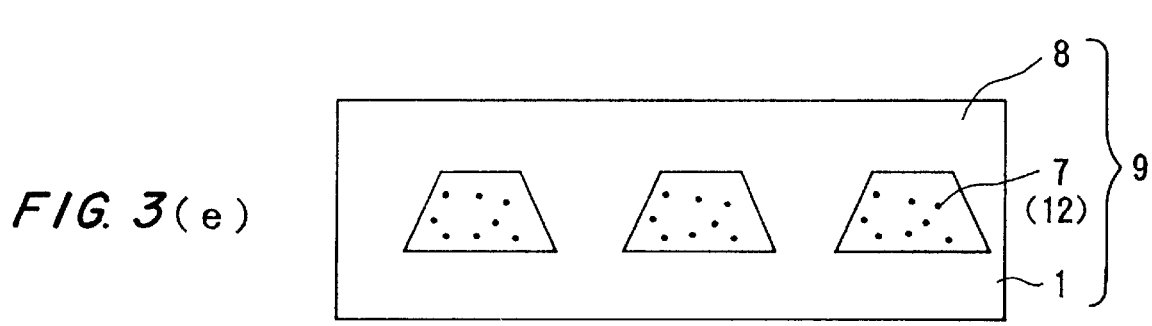

Finally, they are covered by a parent-phase 8 as shown in FIG. 3(e), thereby forming a semiconductor super-atom 9.

When forming a semiconductor super-atom with GaAs as the parent-phase and AlGaAs as the core through this method, GaAs for example, may be used as the parent-phase singlecrystalline substrate 1, and AlGa molecular beam as the liquid-droplet forming molecular beam 4, a sulfur molecular beam as the group VI molecular beam 11, an As molecular beam as the minute-crystal growing molecular beam 6, and undoped Gaps as the parent-phase 6, respectively, so that the liquid droplet 5 in this case would be AlGa, and the epitaxial minute crystal structure 7 would be AlGaAs.

From the study conducted by the inventors of the present invention, it was found that, since the liquid droplet 5 has an active surface, the group VI atoms 12 that fall onto the cross section of the liquid droplet 5 during the irradiation of the group VI molecular beam 11, are easily taken into the liquid droplet 5, but on the other hand, those group VI atoms 12 that do not fall onto the liquid droplet 5 but onto the surface of the parent-phase singlecrystalline substrate 1, are adsorbed only to the extent such that a one-atom layer is formed and no further adsorption does not occur since the one-atom layer forms a stable surface and then one-atom layer of group VI atoms easily desorb by increasing substrate temperature (see FIG. 3(d)).

Accordingly, assuming a case where all the group VI atoms 12 are taken into the liquid droplet 5 having a diameter of approximately 10 nm for example, if the flux of the group VI molecular beam 11 is converted into a beam equivalent pressure, and is set at approximately $10^{-10}$ Torr, the number of the group VI atoms 12 to be taken into the liquid droplet 5 may be controlled with a single-atom level accuracy by controlling the duration of the irradiation of the group VI molecular beam 11.

Therefore, this method provides the control of the number of the group VI atoms 12, or impurity atoms with a single atom level accuracy, that are adsorbed selectively to the liquid droplet 5 (especially metal, liquid droplet), or core, thus, this method realizes a semiconductor super-atom.

Method Using Droplet Epitaxy and d)

Figure 4:
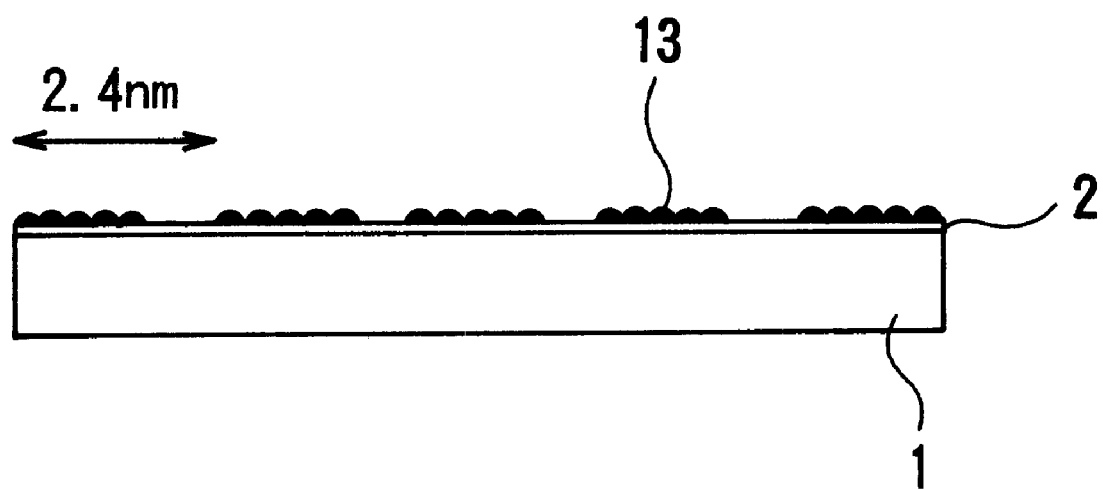
FIG. 4 is a schematic diagram showing the basic concept of the present invention, which illustrates an example of the present method employing droplet epitaxy and a technique utilizing the selective dissolution phenomenon of impurity atoms present on the substrate surface into a metal liquid droplet during the droplet epitaxy.

In this case, a semiconductor super-atom can be fabricated by utilizing the surface of a parent-phase singlecrystalline substrate, which has been terminated with group VI atoms. That is, as shown in FIG. 4, for example, group VI atoms 13 such as sulfur atoms are first adsorbed onto the surface of the parent-phase singlecrystalline substrate 1 to form only a one-atom layer. At this point, by raising the temperature of the parent-phase singlecrystalline substrate 1, selective sublimation of the group VI atoms 13 occurs from its surface. If the group VI atoms 13 were sulfur atoms for example, the coverage thereof would be 5/6 at 400° C. or less, 1/3 at 400° C. to 520° C. 1/12 at 500° C. to 550° C., so that this coverage varies orderly with good reproducibility, Therefore, by first forming a surface with a particular coverage of the group VI atoms 13, then depositing a liquid droplet 5 onto that surface as priorly discussed with reference to FIGS. 1(b)–(e) it is possible to have the group VI atoms 13 dissolved only into the liquid droplets 5, and also to control the number of the group VI atoms 13 that are dissolved into the liquid droplet 5 with a single-atom level accuracy, if the substrate temperature is held at an adequate level.

Among the aforementioned techniques a)–d) that can be employed for doping impurity atoms, a) and b) are particularly effective for the formation of an aggregate of semiconductor super-atoms In a prior art method, it was necessary to manipulate all the atoms constituting a semiconductor super-atom using STM, while in the method of the present invention employing the technique a), STM manipulation is required only on the impurity atoms, so that the site control of the semiconductor super-atoms becomes simpler, and drastic improvement can be expected in throughput.

The present invention is, of course, not limited to the embodiments above discussed, and it is also applicable to quantum dot structures and the aggregates thereof, wherein the relationship of the above explained parent-phase and core materials are reversed, and an impurity controlled with a single-atom level accuracy is doped only into the cores. Also, it should be appreciated that the details may vary in many forms.

As explained heretofore, the present invention allows the formation of a semiconductor nano-structure, or core, with a diameter in the order of 10 nm, and doping of impurity atoms such as donors or acceptors only to the core, with the number of the impurity atoms being controlled with a single-atom level accuracy, thus, realizes a semiconductor super-atom which had been only a concept in the prior art.

While the invention has been described in detail and with reference to specific embodiments thereof, it will be apparent to one skilled in the art that various changes and modifications can be made therein without departing from the spirit and scope thereof.

What is claimed is:

1. A method of making a semiconductor super-atom comprising steps of:

forming a semiconductor nano-structure which constitutes a core by employing droplet epitaxy, and doping impurity atoms into said semiconductor nano-structure by employing a scanning tunneling microscopy technique to promote selective deposition of impurity atoms on a substrate surface, wherein said impurity atoms are selectively introduced only into said core, with the number of said impurity atoms being controlled with a single-atom level accuracy.

2. A method of making an aggregate of semiconductor super-atoms wherein a large number of said semiconductor super-atoms are formed on a substrate using the method described in claim 1, thereby forming an aggregate of said semiconductor super-atoms.

3. A method of making a semiconductor super-atom comprising steps of:
   forming a semiconductor nano-structure which constitutes a core by employing droplet epitaxy, and
   doping impurity atoms into said semiconductor nano-structure by employing a focused electron beam technique to promote selective deposition of impurity atoms on a substrate surface,
   wherein said impurity atoms are selectively introduced only into said core, with the number of said impurity atoms being controlled with a single-atom level accuracy.

4. A method of making an aggregate of semiconductor super-atoms wherein a large number of said semiconductor super-atoms are formed on a substrate using the method described in claim 3, thereby forming an aggregate of said semiconductor super-atoms.

5. A method of making a semiconductor super-atom comprising steps of:
   forming a semiconductor nano-structure which constitutes a core by employing droplet epitaxy, and
   doping impurity atoms into said semiconductor nano-structure by employing a technique to promote selective adsorption of impurity atoms into a liquid droplet during said droplet epitaxy,
   wherein said impurity atoms are selectively introduced only into said core, with the number of said impurity atoms being controlled with a single-atom level accuracy.

6. A method of making an aggregate of semiconductor super-atoms wherein a large number of said semiconductor super-atoms are formed on a substrate using the method described in claim 5, thereby forming an aggregate of said semiconductor super-atoms.

7. A method of making a semiconductor super-atom comprising steps of:
   forming a semiconductor nano-structure which constitutes a core by employing droplet epitaxy, and
   doping impurity atoms into said semiconductor nano-structure by employing a technique to promote selective dissolution of impurity atoms present at a substrate surface into a liquid droplet during said droplet epitaxy,
   wherein said impurity atoms are selectively introduced only into said core, with the number of said impurity atoms being controlled with a single-atom level accuracy.

8. A method of making an aggregate of semiconductor super-atoms wherein a large number of said semiconductor super-atoms are formed on a substrate using the method described in claim 7, thereby forming an aggregate of said semiconductor super-atoms.

* * * * *